(12) United States Patent
Chen et al.

(10) Patent No.: US 10,041,535 B2
(45) Date of Patent: Aug. 7, 2018

(54) SLIDE RAIL ASSEMBLY

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Zong-Sian Wong, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 0 days.

(21) Appl. No.: 15/385,832

(22) Filed: Dec. 20, 2016

(65) Prior Publication Data
US 2018/0031037 A1 Feb. 1, 2018

(30) Foreign Application Priority Data

Jul. 29, 2016 (TW) .............................. 105124374 A

(51) Int. Cl.
*A47B 88/04* (2006.01)
*A47B 88/49* (2017.01)
(Continued)

(52) U.S. Cl.
CPC .............. *F16C 29/10* (2013.01); *A47B 88/43* (2017.01); *A47B 88/443* (2017.01); *A47B 88/477* (2017.01); *A47B 88/49* (2017.01); *A47B 88/57* (2017.01); *H05K 7/1489* (2013.01); *H05K 7/183* (2013.01); *A47B 2088/4235* (2017.01); *A47B 2210/0081* (2013.01)

(58) Field of Classification Search
CPC ....... A47B 88/43; A47B 88/49; A47B 88/443; A47B 88/477; H05K 7/183
See application file for complete search history.

(56) References Cited

U.S. PATENT DOCUMENTS 4,549,773 A * 10/1985 Papp ..................... A47B 88/493
312/334.47
4,560,212 A * 12/1985 Papp ..................... A47B 88/493
312/334.47
(Continued)

FOREIGN PATENT DOCUMENTS

GB 2 434 081 A 7/2007
JP 2004-57567 A 2/2004
JP 3120873 U 4/2006

*Primary Examiner* — Kimberley S Wright
(74) *Attorney, Agent, or Firm* — Winston Hsu

(57) ABSTRACT

A slide rail assembly includes a first rail, a second rail, a third rail, a locking member and an operating member. The second rail is movable relative to the first rail between a first position and a second position. The third rail is movable relative to the second rail. The locking member is mounted to the second rail. When the second rail is located at the second position, the locking member is configured to lock a portion of the first rail, such that the second rail is not movable relative to the first rail from the second position toward the first position. The operating member is configured to be operated by a user to unlock the portion of the first rail from the locking member.

13 Claims, 10 Drawing Sheets

(51) Int. Cl.
*H05K 7/14* (2006.01)
*F16C 29/10* (2006.01)
*H05K 7/18* (2006.01)
*A47B 88/443* (2017.01)
*A47B 88/477* (2017.01)
*A47B 88/43* (2017.01)
*A47B 88/57* (2017.01)
*A47B 88/423* (2017.01)

(56) References Cited

U.S. PATENT DOCUMENTS

| | | | |
|---|---|---|---|
| 5,484,197 A | 1/1996 | Hansen | |
| 6,655,763 B2 * | 12/2003 | Judge | H05K 7/1489 312/334.11 |
| 6,926,377 B2 * | 8/2005 | Lammens | A47B 88/49 312/333 |
| 6,997,529 B1 * | 2/2006 | Chen | A47B 88/493 312/334.44 |
| 7,029,080 B2 * | 4/2006 | Barry, Jr. | H05K 7/1489 312/333 |
| 7,118,277 B2 * | 10/2006 | Chen | A47B 88/40 384/21 |
| 7,357,468 B2 * | 4/2008 | Hwang | A47B 88/49 312/333 |
| 7,571,968 B2 * | 8/2009 | Ji | A47B 88/493 312/333 |
| 7,677,679 B2 | 3/2010 | Hsiung | |
| 7,758,134 B2 * | 7/2010 | Huang | A47B 88/49 312/334.47 |
| 8,147,011 B2 * | 4/2012 | Chen | H05K 7/1489 312/333 |
| 8,240,789 B2 | 8/2012 | Chen | |
| 8,317,278 B2 * | 11/2012 | Enos | A47B 88/493 312/332.1 |
| 8,585,164 B2 * | 11/2013 | Chen | A47B 88/49 312/333 |
| 9,313,914 B2 * | 4/2016 | Judge | H05K 7/1489 |
| 9,386,721 B2 * | 7/2016 | Hsu | H05K 7/1489 |
| 9,675,175 B1 * | 6/2017 | Chen | A47B 88/12 |
| 2001/0040203 A1 * | 11/2001 | Brock | H02B 1/34 248/222.11 |
| 2004/0174104 A1 | 9/2004 | Chen | |
| 2005/0017613 A1 * | 1/2005 | Cirocco | A47B 88/493 312/333 |
| 2005/0116594 A1 * | 6/2005 | Barry, Jr. | H05K 7/1489 312/334.4 |
| 2007/0164644 A1 * | 7/2007 | Hwang | A47B 88/49 312/333 |
| 2008/0111457 A1 * | 5/2008 | Ji | A47B 88/493 312/334.44 |
| 2009/0058241 A1 * | 3/2009 | Huang | A47B 88/49 312/334.8 |
| 2009/0195133 A1 * | 8/2009 | Chang | A47B 88/493 312/334.46 |
| 2010/0019638 A1 * | 1/2010 | Duan | G06F 1/183 312/334.44 |
| 2011/0135224 A1 * | 6/2011 | Chen | F16C 29/04 384/26 |
| 2012/0043872 A1 * | 2/2012 | Enos | A47B 88/493 312/332.1 |
| 2012/0308297 A1 * | 12/2012 | Chen | A47B 88/49 403/109.2 |
| 2015/0208802 A1 | 7/2015 | Yoneda | |

* cited by examiner

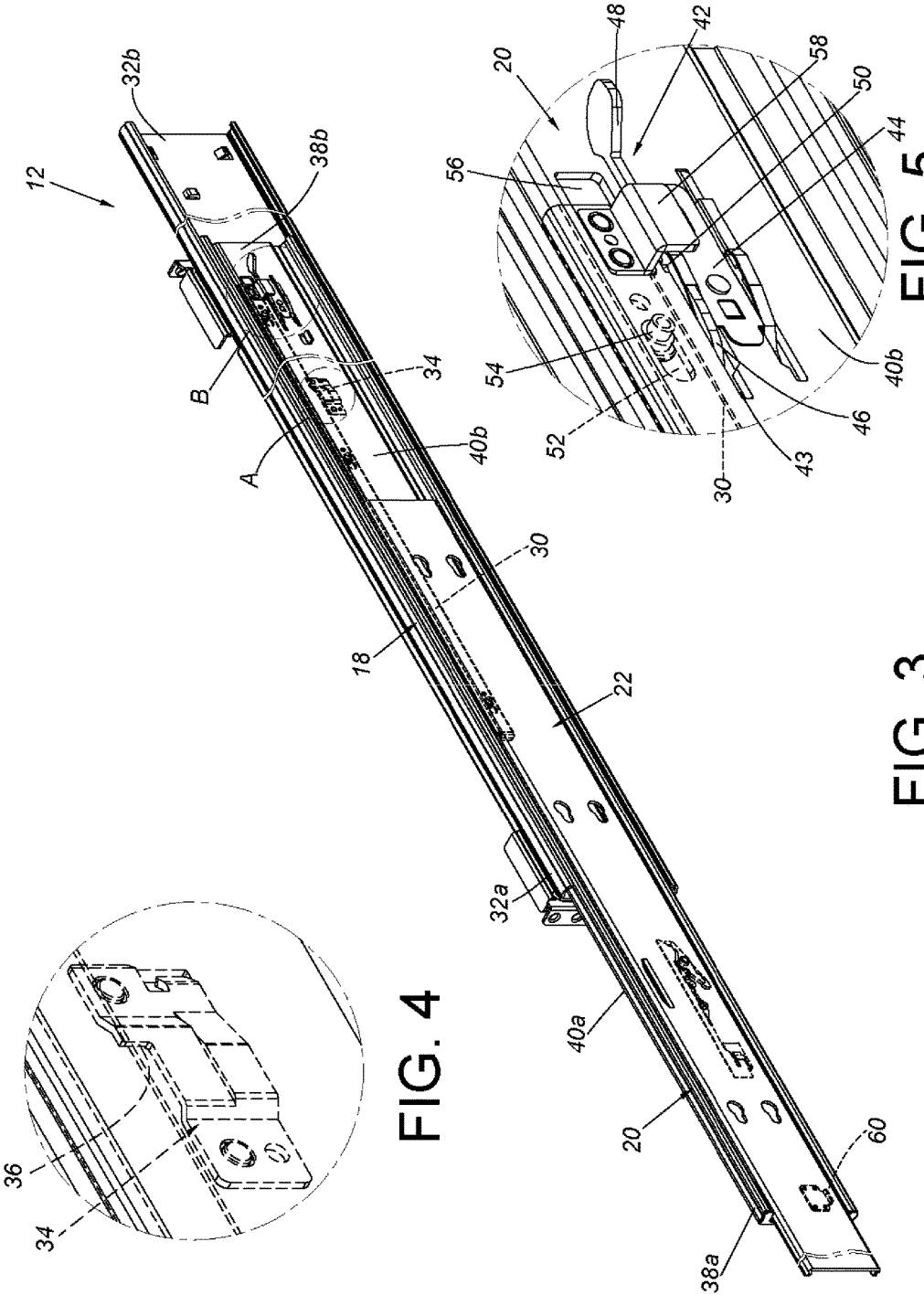

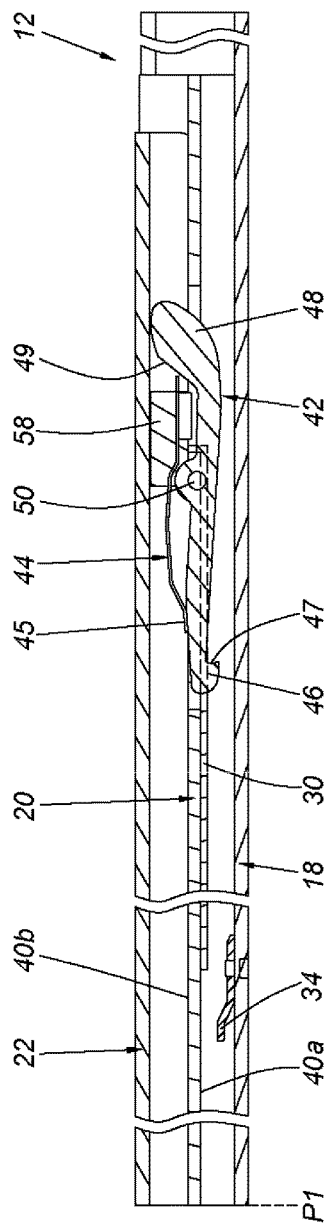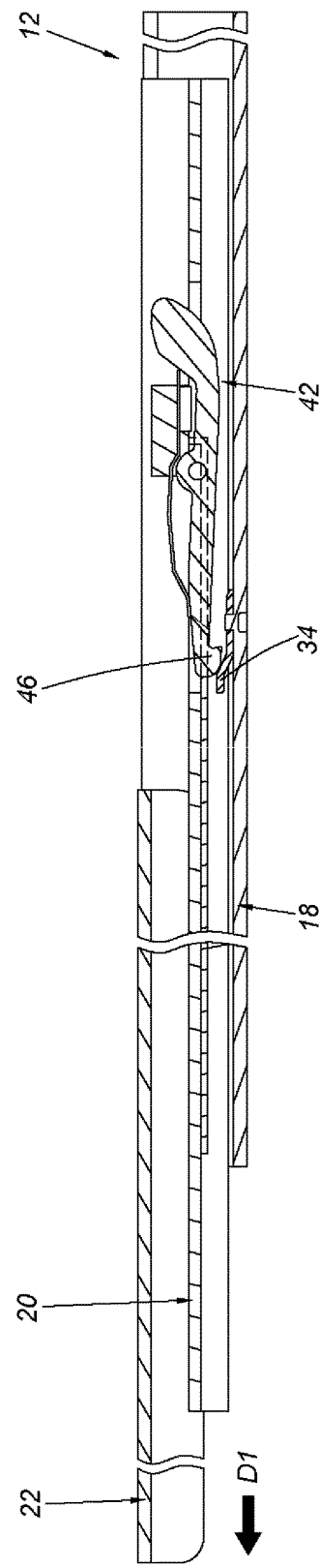
FIG. 8
FIG. 9

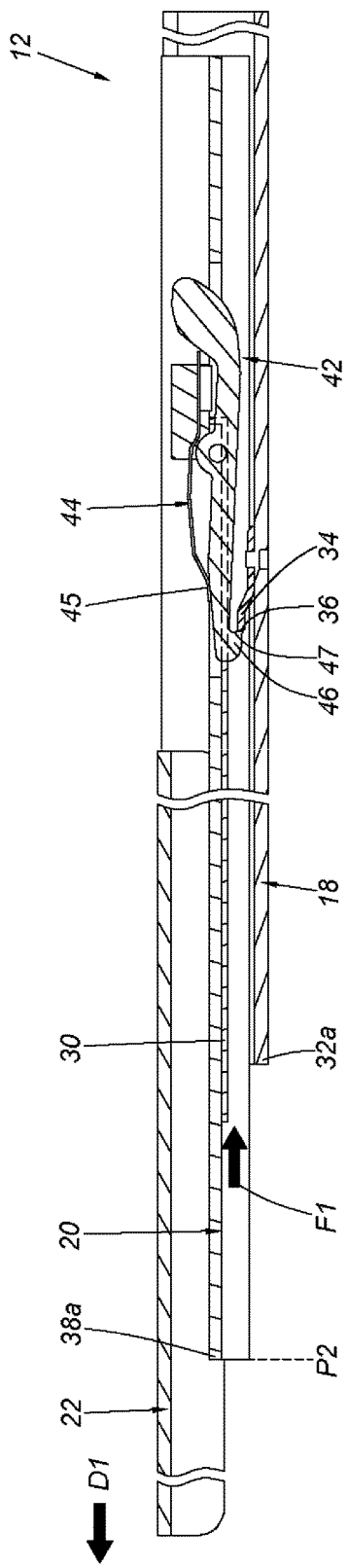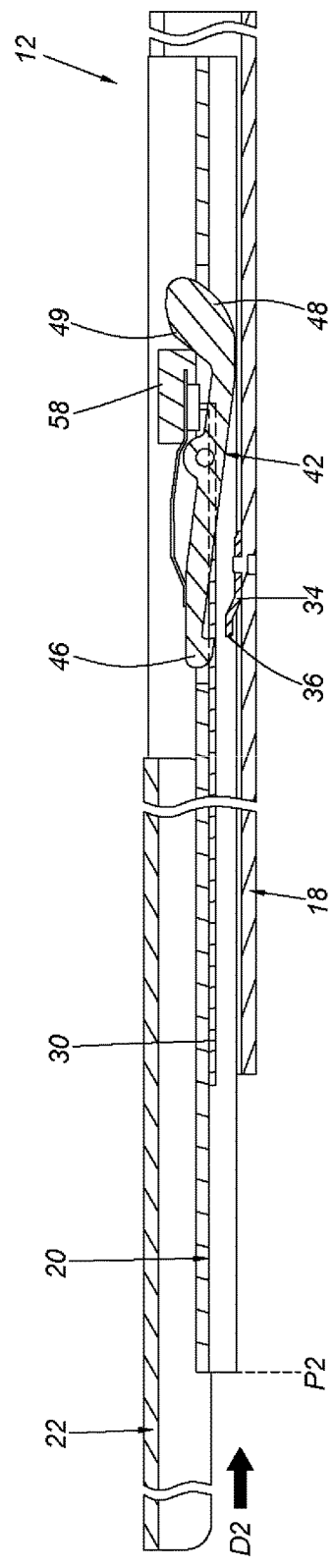

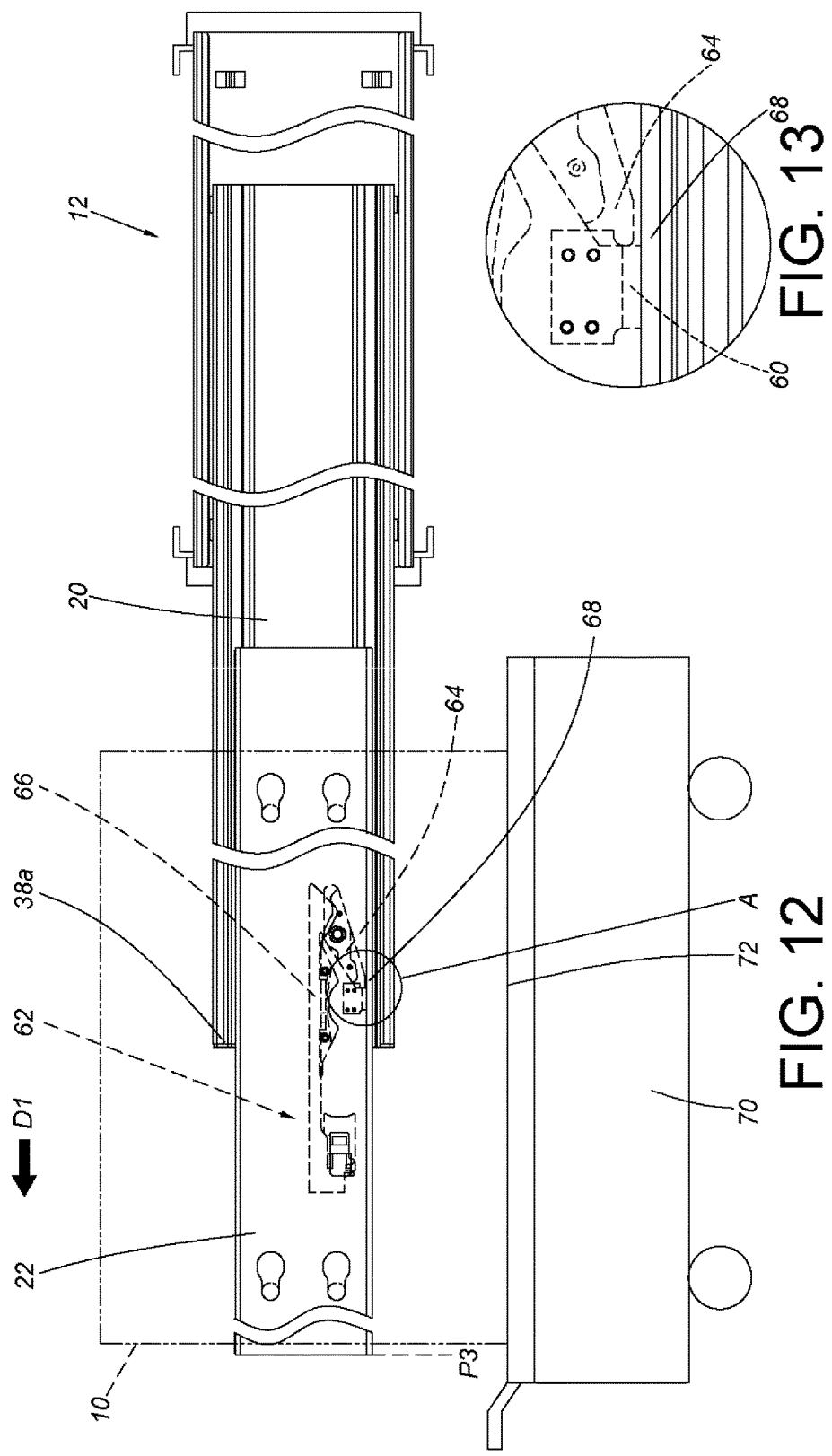

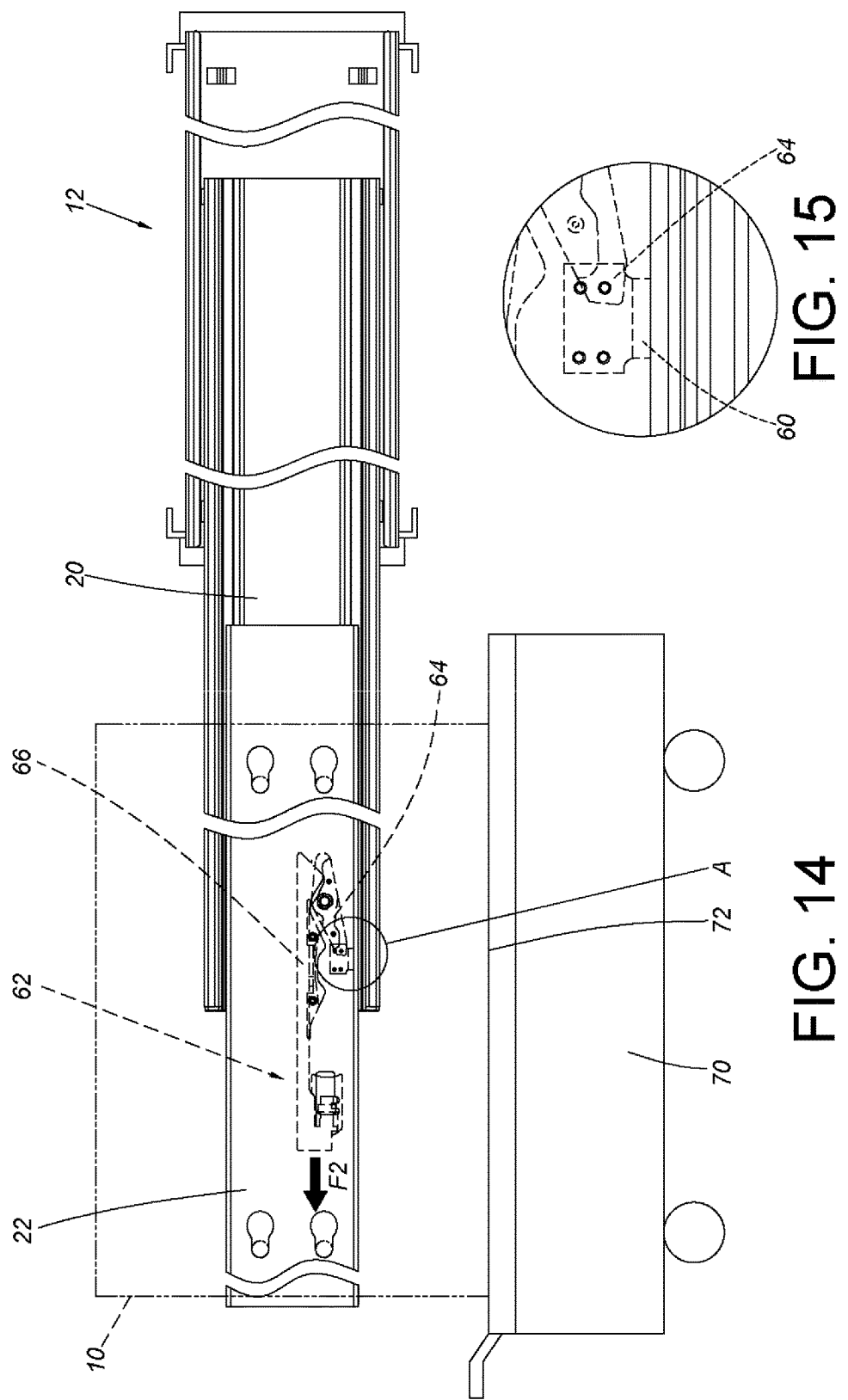

SLIDE RAIL ASSEMBLY

BACKGROUND OF THE INVENTION

1. Field of the Invention

The present invention relates to a slide rail assembly, and more particularly, to a slide rail assembly capable of releasing a locking relationship between two rails through operating an operating member.

2. Description of the Prior Art

Generally, a slide rail assembly usually comprises at least two rails. The rails can be moved relative to each other in order to allow the slide rail assembly to be in an extended state or a retracted state.

U.S. Pat. No. 7,677,679 B2 discloses a slide assembly. The slide assembly comprises a first slide (10), a second slide (20) and a third slide (30). The first slide (10) comprises a stop (14) and a block (16). The second slide has a stop piece (28) and a slot (26) for movably receiving a retention pin (40). When the first, second and third slides are in a fully extended state, the retention pin (40) and the stop piece (28) are resisted by the stop (14) and the block (16) of the first slide respectively, thereby restraining sliding movement between the second slide and the first slide. Wherein, when the third slide (30) is retracted from a fully extended state to a semi-extended state along a retraction direction, the retention pin (40) is lifted by a releasing member (50) of the third slide (30) and disengaged from the stop (14), thereby allowing the second slide (20) to retract into the first slide (10).

U.S. Pat. No. 8,240,789 B2 discloses a slide assembly. The slide assembly comprises a first rail (10), a second rail (20) and a third rail (30). Wherein, the first rail (10) comprises a positioning portion (16); on the other hand, a positioning device (50) is arranged on the second rail (20). The positioning device (50) comprises a positioning member (52) and an engaging member (68) pivotally connected to the positioning member (52). As shown in FIG. 6, FIG. 7, and FIG. 8 of the case, when the second rail (20) is pulled out relative to the first rail (10) along an extension direction, an engaging portion (74) of the engaging member (68) is positioned and hooked to a stop end (18) of the positioning portion (16) of the first rail (10), such that the second rail (20) is not able to move relative to the first rail (10) along a retraction direction. In such state, the third rail (30) can be pulled out relative to the second rail (20) to be in an extension state along the extension direction. As shown in FIG. 9 of the case, when the third rail (30) is retracted relative to the second rail (20) along the retraction direction, a sidewall (34) of the third rail (30) movably presses an extension wing (76) of the engaging member (68), so that the engaging member (68) is deflected to allow the engaging portion (74) to detach from the stop end (18) of the positioning portion (16) of the first rail (10). As such, the second rail (20) can be retracted relative to the first rail (10) along the retraction direction.

Both of the aforementioned two cases use the third rail or an accessory attached to the third rail to release a locking relationship between the second rail and the first rail, so as to allow the second rail to be retracted relative to the first rail from an extension state along the retraction direction. However, for different application environments or market requirements of the slide rail assembly, sometimes it is not suitable to retract the third rail relative to the second rail for releasing such locking relationship. Therefore, it is important to develop a slide rail assembly to release the locking relationship between the second rail and the first rail without using the third rail.

SUMMARY OF THE INVENTION

The present invention relates to a slide rail assembly comprising an operating member to be operated by a user for releasing a locking relationship between two rails.

According to an embodiment of the present invention, a slide rail assembly comprises a first rail, a second rail, a third rail, a locking mechanism and an operating member. The second rail is movable relative to the first rail between a first position and a second position. The third rail is movable relative to the second rail. The locking mechanism is configured to be in a first state or a second state, wherein when the locking mechanism is in the first state, the locking mechanism is configured to prevent the second rail from being moved relative to the first rail from the second position toward the first position. The operating member is configured to be manually operated to switch the locking mechanism from the first state to the second state, in order to allow the second rail to be movable relative to the first rail from the second position toward the first position.

Preferably, the locking mechanism comprises a locking member movably mounted to the second rail, and an elastic member configured to provide an elastic force to the locking member.

Preferably, the slide rail assembly further comprises a pivoting member configured to pivot the locking member to the second rail, wherein the first rail comprises a blocking feature, when the locking member is in the first state, the locking member is configured to lock the blocking feature.

Preferably, the operating member is movably mounted to the second rail.

Preferably, the second rail has a first side and a second side opposite to the first side, the operating member is located at the first side of the second rail.

Preferably, the second rail further has an extension hole, and the operating member comprises an auxiliary feature passing through the extension hole and located at the second side of the second rail, the auxiliary feature is configured to drive the locking mechanism to switch from the first state to the second state in response to the operating member being manually operated.

Preferably, the operating member has an elongated hole, the slide rail assembly further comprises a supporting member, the supporting member passes through a portion of the elongated hole for mounting the operating member to the second rail.

Preferably, the second rail comprises an abutting feature, the slide rail assembly further comprises a releasing mechanism, the releasing mechanism comprises a linking member arranged on the third rail, when the linking member is in a first linking state, the linking member is located at a position corresponding to the abutting feature, and when the linking member is in a second linking state, the linking member is located at a position not corresponding to the abutting feature.

Preferably, the releasing mechanism further comprises a releasing member operatively connected to the linking member, the linking member is configured to switch from the first linking state to the second linking state in response to operation of the releasing member.

According to another embodiment of the present invention, a slide rail assembly comprises a first rail, a second rail, a third rail, a locking member and an operating member. The second rail is movable relative to the first rail between a retracted position and an extended position. The third rail is movable relative to the second rail. The locking member is mounted to the second rail, wherein the locking member is configured to lock a portion of the first rail when the second rail is located at the extension position, such that the second rail is not movable relative to the first rail from the extension position toward the retracted position. The operating member is configured to be manually operated to unlock the portion of the first rail from the locking member.

According to yet another embodiment of the present invention, a slide rail assembly is configured to mount a carried object to a rack. The slide rail assembly comprises a first rail, a second rail, a third rail, a locking member and an operating member. The first rail is mounted to the rack through a first bracket and a second bracket. The second rail is movable relative to the first rail between a retracted position and an extension position. The third rail is movable relative to the second rail and configured to be mounted with the carried object. The locking member is mounted to the second rail, wherein the locking member is configured to lock a portion of the first rail when the second rail is located at the extension position, such that the second rail is not movable relative to the first rail from the extension position toward the retracted position. The operating member is configured to be manually operated to unlock the portion of the first rail from the locking member.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 3 is a diagram showing a third rail and a third rail of the slide rail assembly being in an extended state relative to a first rail according to an embodiment of the present invention.

FIG. 4 is an enlarged view of an area A of FIG. 3 for showing detail of a portion of the first rail.

FIG. 5 is an enlarged view of an area B of FIG. 3 for showing partial features of a locking member of a locking mechanism and an operating member.

FIG. 8 is a diagram showing the slide rail assembly being in a retracted state according to an embodiment of the present invention.

FIG. 9 is a diagram showing the second rail and the third rail of the slide rail assembly being moved relative to the first rail along an extension direction according to an embodiment of the present invention, wherein the locking member of the locking mechanism contacts a portion of the first rail.

FIG. 10 is a diagram showing the second rail and the third rail being further moved relative to the first rail along the extension direction according to an embodiment of the present invention, wherein the locking member of the locking mechanism locks the portion of the first rail, such that the second rail cannot be retracted relative to the first rail along a retraction direction.

FIG. 11 is a diagram showing the operating member of FIG. 10 being applied with a force in order to unlock the portion of the first rail from the locking member of the locking mechanism, such that the second rail is able to be retracted relative to the first along the retraction direction.

FIG. 12 is a diagram showing a linking member abutting against an abutting feature of the second rail when the third rail of the slide rail assembly is moved relative to the second rail to a position along the extension direction according to an embodiment of the present invention, wherein a working cart is configured to carry the carried object of the third rail.

FIG. 13 is an enlarged view of an area A of FIG. 12 for illustrating the linking member abutting against the abutting feature of the second rail.

FIG. 14 is a diagram showing a releasing member being applied with a force for driving the linking member to move and disengage from the abutting feature of the second rail when the third rail of the slide rail assembly of FIG. 12 is located at the position relative to the second rail.

FIG. 15 is an enlarged view of an area A of FIG. 14 for illustrating the linking member being disengaged from the abutting feature of the second rail.

DETAILED DESCRIPTION

Figure 1:
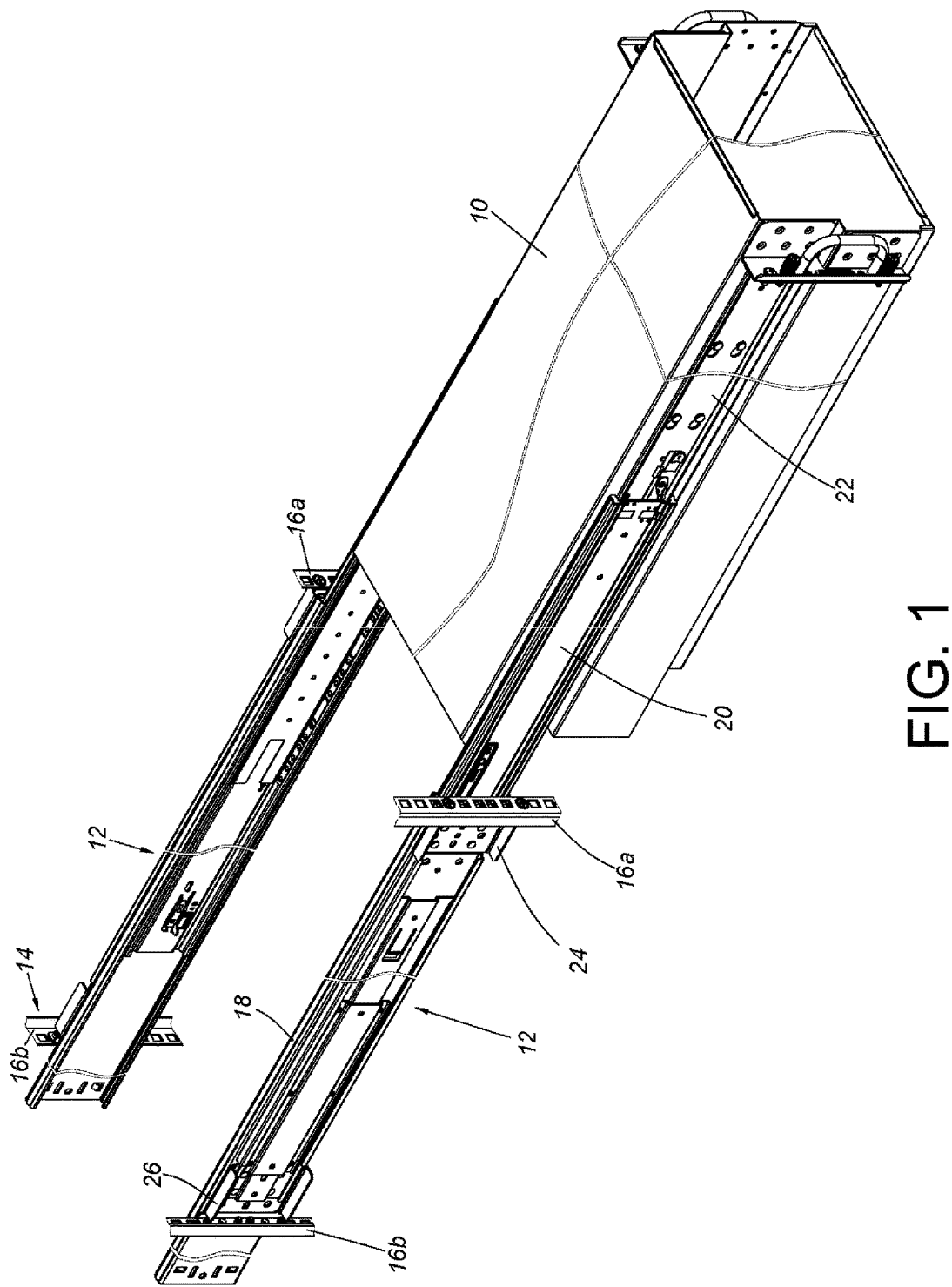
FIG. 1 is a diagram showing a slide rail assembly configured to mount a carried object to a rack and the carried object being moved outside the rack through the slide rail assembly according to an embodiment of the present invention.

FIG. 1 is a diagram showing a carried object 10 being mounted to a rack 14 through a pair of slide rail assemblies 12. The carried object 10 can be a chassis of an electronic apparatus or a drawer. The rack 14 comprises a pair of first posts 16a and a pair of second posts 16b. In particular, each of the slide rail assemblies 12 comprises a first rail 18, a second rail 20 and a third rail 22. The first rail 18 has two portions respectively arranged with a first bracket 24 and a second bracket 26, in order to be mounted to the first posts 16a and the second posts 16b of the rack 14. In addition, the third rail 22 is configured to mount the carried object 10. According to such arrangement, through arranging the second rail 20 and the third rail 22 in an extended state relative to the first rail 18, the carried object 10 can be located outside the rack 14.

Figure 2:
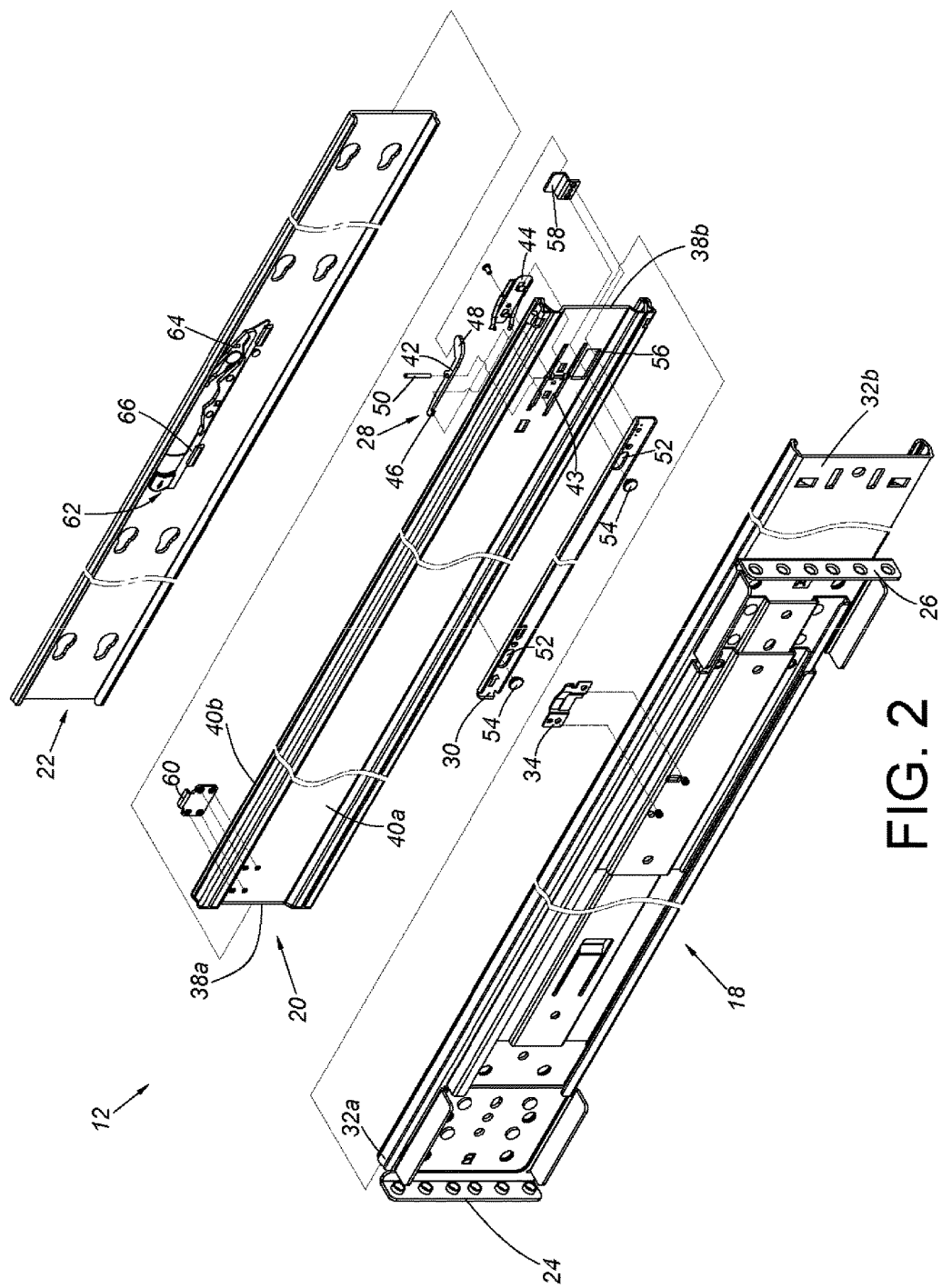
FIG. 2 is an exploded view of the slide rail assembly according to an embodiment of the present invention.

FIG. 2 is an exploded view of the first rail 18, the second rail 20 and the third rail 22 of the slide rail assembly 12. In the present embodiment, the slide rail assembly 12 further comprises a locking mechanism 28 and an operating member 30.

As shown in FIG. 3 and FIG. 4, the first rail 18 has a front end 32a and a rear end 32b. A portion 34 is arranged between the front end 32a and the rear end 32b of the first rail 18. The portion 34 comprises a blocking feature 36. Wherein, the blocking feature 36 can be a protrusion, recession, hole or groove, but the present invention is not limited thereto. In particular, the portion 34 can be an additional part attached to the first rail 18 by riveting, welding, screwing or engaging. Or, the portion 34 can be directly and integrally formed on the first rail 18. For example, the portion 34 can be formed on the first rail 18 to have a predetermined structure or shape through machining.

The second rail 20 is movable relative to the first rail 18. Furthermore, the second rail 20 has a front end 38a, a rear end 38b, a first side 40a and a second side 40b opposite to the first side 40a. Wherein, the first side 40a of the second rail 20 faces toward the first rail 18, and the second side 40b of the second rail 20 faces toward the third rail 22.

As shown in FIG. 2, FIG. 3 and FIG. 5, the locking mechanism 28 comprises a locking member 42. Preferably, the locking mechanism 28 further comprises an elastic member 44. Preferably, the second rail 20 has a mounting hole 43. The locking member 42 is located at a position corresponding to the mounting hole 43. In particular, the locking member 42 has a first part 46 and a second part 48. The first part 46 is partially extended out of the first side 40a of the second rail 20. The second part 48 is partially extended out of the second side 40b of the second rail 20. In the present embodiment, the slide rail assembly 12 further comprises a pivoting member 50 arranged between the first part 46 and the second part 48. The pivoting member 50 is configured to pivot the locking member 42 to the second rail 20. On the other hand, the elastic member 44 is configured to provide an elastic force to the locking member 42.

The operating member 30 is movably mounted to the second rail 20. Preferably, the operating member 30 is located at the first side 40a of the second rail 20 and arranged along a longitudinal direction of the second rail 20. The operating member 30 comprises at least one elongated hole 52. In the present embodiment, the operating member 30 comprises a plurality of elongated holes 52 spaced from each other. The slide rail assembly 12 further comprises at least one supporting member 54. In the present embodiment, the slide rail assembly 12 further comprises a plurality of supporting members 54. Each of the supporting members 54 passes through a portion of the corresponding elongated hole 52 in order to mount the operating member 30 to the second rail 20. Wherein, the elongated holes 52 are longitudinally arranged. Preferably, the second rail 20 further comprises an extension hole 56, and the extension hole 56 is longitudinally arranged. The operating member 30 is arranged with an auxiliary feature 58 passing through a portion of the extension hole 56. The auxiliary feature 58 is located at the second side 40b of the second rail 20. Preferably, the auxiliary feature 58 is bent relative to the operating member 30, and the auxiliary feature 58 is located at a position corresponding to the second part 48 of the locking member 42. Wherein, the auxiliary feature 58 can be directly and integrally formed on the operating member 30. Or, in the present embodiment, the auxiliary feature 58 can be an additional part attached to the operating member 30 by riveting, welding, screwing or engaging.

Preferably, the second rail 20 further comprises an abutting feature 60. Wherein, the abutting feature 60 can be formed on the second rail 20 to have a specific structure or shape through machining. Or, in the present invention, an additional part having the abutting feature 60 is attached to the second rail 20 by riveting, welding, screwing or engaging. The abutting feature 60 can be a protrusion and faces toward the third rail 22. For example, the abutting feature 60 is transversely protruded from the second side 40b of the second rail 20.

The third rail 22 is movable relative to the second rail 20. Furthermore, the slide rail assembly 12 further comprises a releasing mechanism 62. The releasing mechanism 62 comprises a linking member 64 arranged on the third rail 22. Preferably, the releasing mechanism 62 further comprises a releasing member 66 operatively connected to the linking member 64. Preferably, the releasing member 66 is arranged along a longitudinal direction of the third rail 22.

Figure 6:
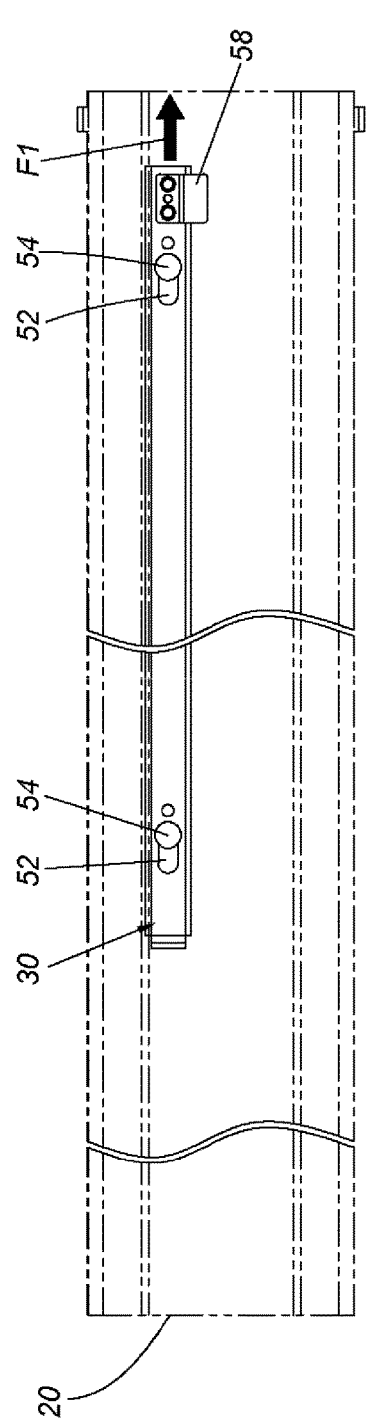
FIG. 6 is a diagram showing the operating member of the slide rail assembly being operated according to an embodiment of the present invention.
Figure 7:
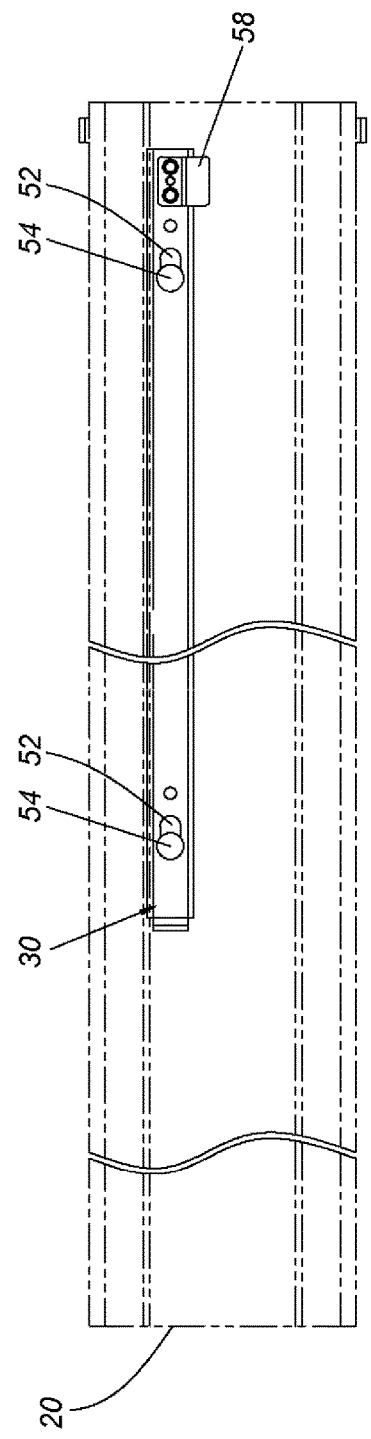
FIG. 7 is a diagram showing the operating member of FIG. 6 being operated to move relative to the second rail.

As shown in FIG. 6 and FIG. 7, the operating member 30 is arranged on the second rail 20. The operating member 30 can be moved relative to the second rail 20 in response to a first force F1 applied by a user, and the auxiliary feature 58 can be further moved in response to the operating member 30 being manually operated.

As shown in FIG. 8, the slide rail assembly 12 is in a retracted state. Wherein, the locking member 42 is pivoted to the second rail 20 by the pivoting member 50. The first part 46 of the locking member 42 has a hook section 47, and the second part 48 of the locking member 42 has a contact section 49 with an inclined surface or a curved surface. In addition, the elastic member 44 has an elastic part 45. The elastic part 45 of the elastic member 44 is configured to provide an elastic force to the locking member 42. For example, the elastic part 45 provides the elastic force to the first part 46, so as to keep the first part 46 of the locking member 42 facing toward the first rail 18. On the other hand, the operating member 30 is located at the first side 40a of the second rail 20, and the auxiliary feature 58 is located at the second side 40b of the second rail 20. The auxiliary feature 58 is located at a position corresponding to the second part 48 of the locking member 42, such as corresponding to the contact section 49 of the second part 48.

As shown in FIG. 9, the second rail 20 is movable relative to the first rail 18 from a first position P1 (such as a retracted position) along an extension direction D1, and the third rail 22 is movable relative to the second rail 20 along the extension direction D1. As such, the second rail 20 and the third rail 22 can be moved relative to the first rail 18 to be in an extended state. When the second rail 20 is moved relative to the first rail 18 from the first position P1 along the extension direction D1, the first part 46 of the locking member 42 contacts the portion 34 of the first rail 18.

As shown in FIG. 10, when the second rail 20 is further moved relative to the first rail 18 along the extension direction D1 to a second position P2 (such as an extension position), the locking mechanism 28 is in a first state. For example, the locking member 42 of the locking mechanism 28 is in the first state in response to the elastic force of the elastic member 44. In particular, the hook section 47 of the first part 46 of the locking member 42 is held to lock the portion 34 of the first rail 18 in response to the elastic part 45 of the elastic member 44. When the locking mechanism 28 is in the first state, the first part 46 of the locking member 42 is configured to lock the blocking feature 36 of the portion 34 of the first rail 19, such that the locking member 42 of the locking mechanism 28 can prevent the second rail 20 from being moved relative to the first rail 18 from the second position P2 toward the first position P1 along a retraction direction. That is, the second rail 20 is not movable relative to the first rail 18 from the second position (such as the extension position) toward the first position (such as the retracted position). When the second rail 20 is located at the second position P2 relative to the first rail 18, the front end 38a of the second rail 20 extends beyond the front end 32a of the first rail 18, and a portion of the operating member 30 extends beyond the front end 32a of the first rail 18 as well. On the other hand, the third rail 22 can be further moved relative to the second rail 20 along the extension direction D1. Therefore, a front end of the third rail 22 extends beyond the front end 38a of the second rail 20. Accordingly, the slide rail assembly 12 is in the extended state, such as a fully extended state.

As shown in FIG. 11, when the slide rail assembly 12 is in the extended state, and a user wants to unlock the portion 34 of the first rail 18 from the second rail 20, the user can manually apply the first force F1 (also refer to FIG. 6 and FIG. 7) to the operating member 30, such that the operating member 30 drives the locking mechanism 28 to switch from the first state to the second state. Specifically, the operating member 30 is moved relative to the second rail 20 in response to the first force F1, so as to drive the auxiliary feature 58 to abut against the contact section 49 of the second part 48 of the locking member 42, such that the locking member 42 is deflected to unlock the portion 34 of the first rail 18 from the first part 46. That is, the first part 46 of the locking member 42 is detached from the portion 34 of the first rail 18. In other words, the auxiliary feature 58 is configured to drive the locking member 42 to switch from the first state to the second state in response to the operating member 30 being manually operated. When the locking mechanism 28 is in the second state, the second rail is movable relative to the first rail 18 from the second position P2 toward the first position P1 along the retraction direction D2.

As shown in FIG. 12 and FIG. 13, the linking member 64 of the releasing mechanism 62 is movably mounted, such as pivoted, to the third rail 22. In the present embodiment, the linking member 64 is located between a wall 68 of the third rail 22 and the releasing member 66. The linking member 64 is in a first linking state.

In one operation mode, the third rail 22 is mounted with the carried object 10. When the third rail 22 is further moved relative to the second rail 20 along the extension direction D1 to a predetermined extension position P3, the third rail 22 extends beyond the front end 38a of the second rail 20. Wherein, when the linking member 64 is in the first linking state, the linking member 64 is located at a position corresponding to the abutting feature 60. That is, when the third rail 22 is located at the predetermined extension position P3 relative to the second rail 20, the linking member 64 in the first linking state is located at the position corresponding to the abutting feature 60 to abut against the abutting feature 60 of the second rail 20, such that the third rail 22 cannot be further moved relative to the second rail 20 along the extension direction D1. In such state, the user can prepare a working cart 70 for carrying the carried object 10 in advance, in order to support a portion of the carried object 10, such as a bottom part 72 of the carried object 10.

As shown in FIG. 14 and FIG. 15, the user can manually apply a second force F2 to the releasing member 66 in order to detach the third rail 22 from the second rail 20. The linking member 64 is deflected to switch from the first linking state to a second linking state in response to the releasing member 66 being manually operated by the user, such that the linking member 64 is located at a position not corresponding to the abutting feature 60. In such state, the third rail 22 is detachable from the second rail 20.

Figure 16:
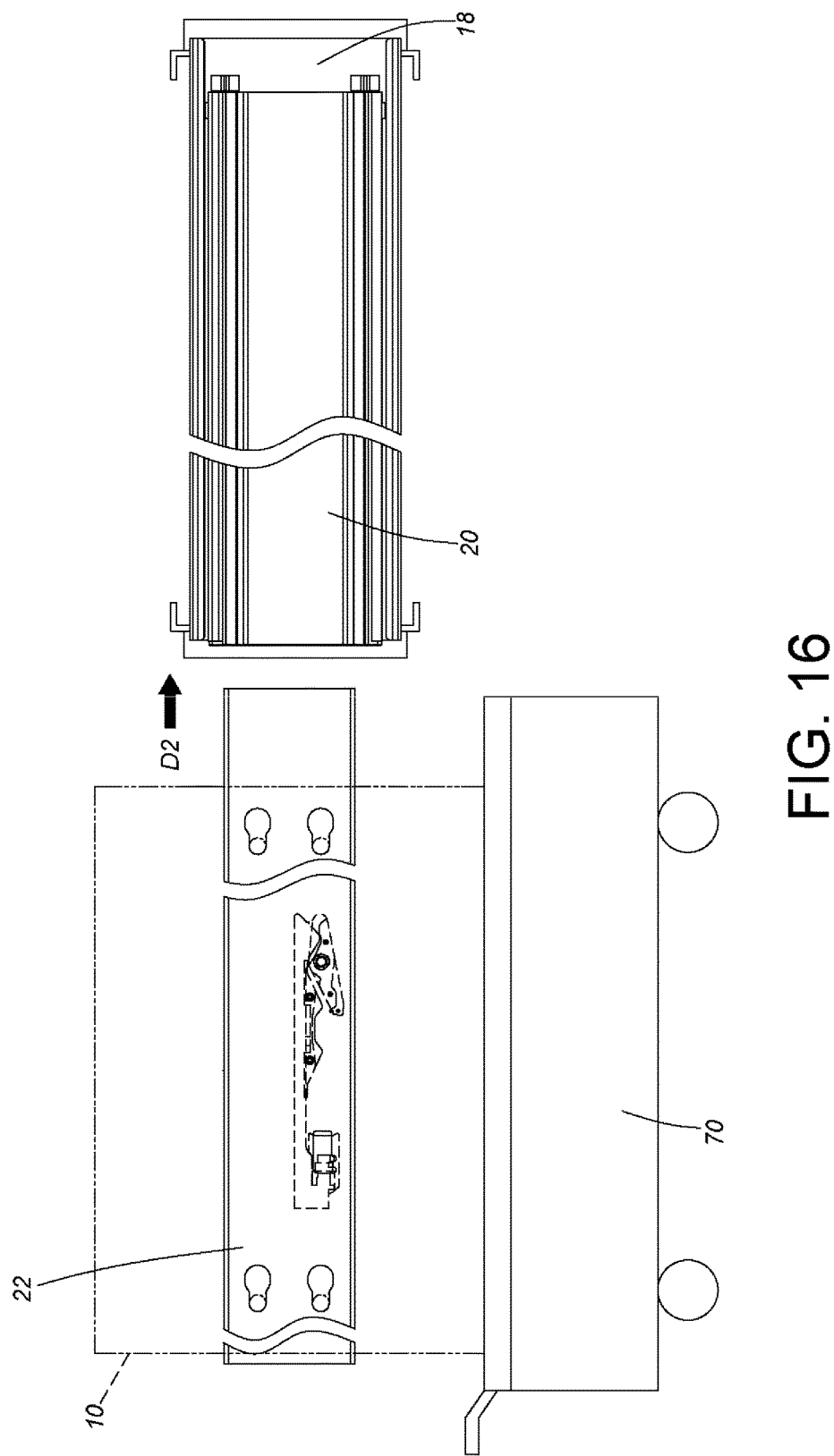
FIG. 16 is a diagram showing the second rail of the slide rail assembly of FIG. 14 being retracted relative to the first rail, and the third rail being detached from the second rail.

Furthermore, as shown in FIG. 16, the second rail 20 can be retracted relative to the first rail 18 along the retraction direction D2 by the user (operation of retracting the second rail 20 relative to the first rail 18 along the retraction direction D2 can refer to FIG. 11 and related illustration, no further illustration is provided for simplification), in order to detach the third rail 22 from the second rail 20 with the carried object 10 being supported by the working cart 70. Thereby, detaching operation of the third rail 22 is completed.

Figure 17:
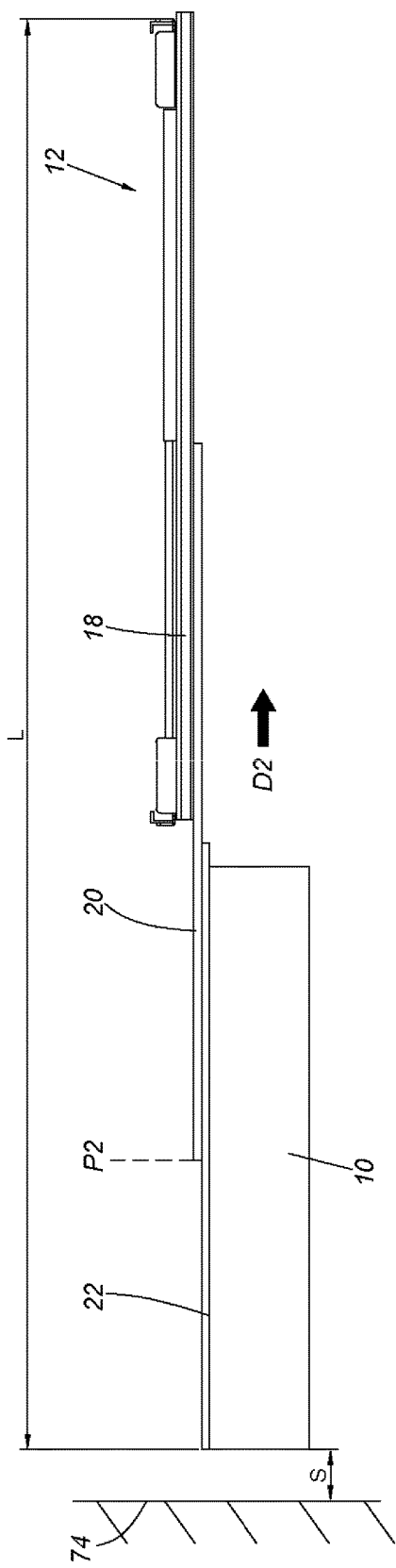
FIG. 17 is a diagram showing the slide rail assembly being in an extension state and a limited space being defined between the slide rail assembly and an environmental barrier according to an embodiment of the present invention.
Figure 18:
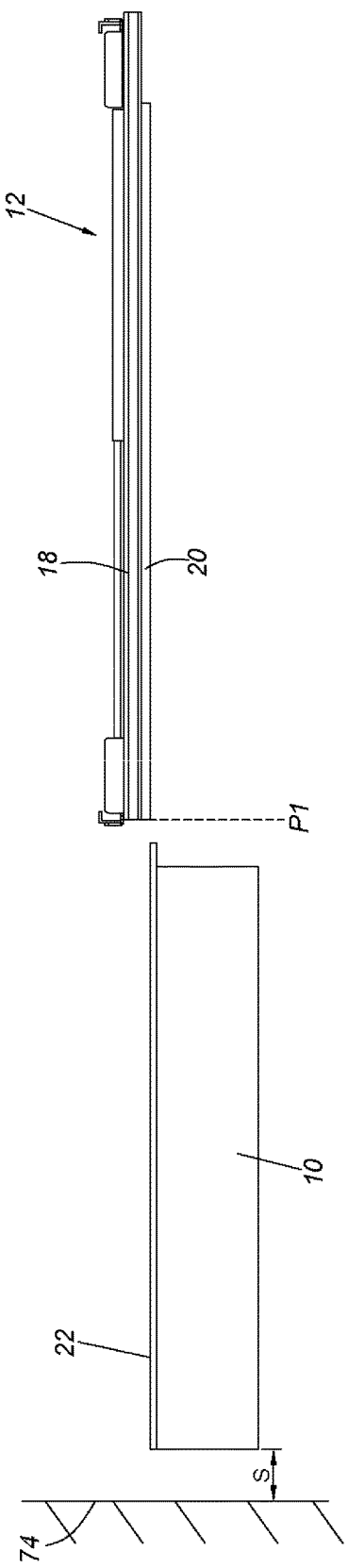
FIG. 18 is a diagram showing the second rail being retracted relative to the first rail and the third rail being detached from the second rail in the environment with the limited space, so as to complete detaching operation of the third rail.

As shown in FIG. 17 and FIG. 18, when the slide rail assembly 12 is in the extended state (such as the fully extended state), the slide rail assembly 12 has an extension length L. When the slide rail assembly 12 is extended to have the extension length L, and a limited space S (such as a narrow space) is defined between the slide rail assembly 12 and an environmental barrier 74, it is difficult for the user to perform maintenance to the slide rail assembly 12 or the carried object 10. For example, due to blocking of the environmental barrier 74, it is difficult for the user to detach the third rail 22 from the second rail 20 along the extension direction D1. Therefore, through the arrangements of the slide rail assembly 12 of the present invention, the user can manually and directly operates the operating member 30 to drive the locking member 42 of the locking mechanism 28 to switch from the first state to the second state, such that the second rail 28 can be moved relative to the first rail 18 from the second position P2 toward the first position P1 along the retraction direction D2. As such, even in the environment with the limited space S, the user can still conveniently detach the third rail 22.

Therefore, the locking mechanism 28 and the releasing mechanism 62 of the present invention respectively provide the operating member 30 and the releasing member 66 to be manually operated by the user, in order to facilitate detachment of the rail (such as the third rail 22) or the carried object 10 in a specific environment (such as the environment with a limited space).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A slide rail assembly, comprising:
   a first rail;
   a second rail movable relative to the first rail between a first position and a second position;
   a third rail movable relative to the second rail;
   a locking mechanism configured to be in a first state or a second state, wherein when the locking mechanism is in the first state, the locking mechanism is configured to prevent the second rail from being moved relative to the first rail from the second position toward the first position; and
   an operating member configured to be manually operated to switch the locking mechanism from the first state to the second state, in order to allow the second rail to be movable relative to the first rail from the second position toward the first position;
   wherein the second rail has a first side and a second side opposite to the first side, the operating member is located at the first side of the second rail, the second rail further has an extension hole, and the operating member comprises an auxiliary feature passing through the extension hole and located at the second side of the second rail wherein the second rail comprises an abutting feature, the slide rail assembly further comprises a releasing mechanism, the releasing mechanism comprises a linking member arranged on the third rail, when the linking member is in a first linking state, the linking member is located at a position corresponding to the abutting feature, and when the linking member is in a second linking state, the linking member is located at a position not corresponding to the abutting feature, wherein the releasing mechanism further comprises a releasing member operatively connected to the linking member, the linking member is configured to switch from the first linking state to the second linking state in response to operation of the releasing member.

2. The slide rail assembly of claim 1, wherein the locking mechanism comprises a locking member movably mounted to the second rail, and an elastic member configured to provide an elastic force to the locking member.

3. The slide rail assembly of claim 2, further comprising a pivoting member configured to pivot the locking member to the second rail, wherein the first rail comprises a blocking feature, when the locking member is in the first state, the locking member is configured to lock the blocking feature.

4. The slide rail assembly of claim 1, wherein the operating member is movably mounted to the second rail.

5. The slide rail assembly of claim 1, wherein the auxiliary feature is configured to drive the locking mechanism to switch from the first state to the second state in response to the operating member being operated.

6. The slide rail assembly of claim 4, wherein the operating member has an elongated hole, the slide rail assembly further comprises a supporting member, the supporting member passes through a portion of the elongated hole for mounting the operating member to the second rail.

7. A slide rail assembly, comprising:
a first rail;
a second rail movable relative to the first rail between a retracted position and an extension position;
a third rail movable relative to the second rail;
a locking member mounted to the second rail, wherein the locking member is configured to lock a portion of the first rail when the second rail is located at the extension position, such that the second rail is not movable relative to the first rail from the extension position toward the retracted position; and
an operating member configured to be manually operated to unlock the portion of the first rail from the locking member;
the second rail has a first side and a second side opposite to the first side, the first side faces toward the first rail, the second side faces toward the third rail, the operating member is located at the first side of the second rail, the second rail further has an extension hole, and the operating member comprises an auxiliary feature passing through the extension hole and located at the second side of the second rail wherein the second rail comprises an abutting feature, the slide rail assembly further comprises a releasing mechanism, the releasing mechanism comprises a linking member arranged on the third rail, when the linking member is in a first linking state, the linking member is located at a position corresponding to the abutting feature, and when the linking member is in a second linking state, the linking member is located at a position not corresponding to the abutting feature, wherein the releasing mechanism further comprises a releasing member operatively connected to the linking member, the linking member is configured to switch from the first linking state to the second linking state in response to operation of the releasing member.

8. The slide rail assembly of claim 7, further comprising an elastic member, wherein the locking member is held to lock the portion of the first rail in response to the elastic force of the elastic member.

9. The slide rail assembly of claim 7, wherein the auxiliary feature is configured to drive the locking member in response to the operating member being operated, in order to unlock the portion of the first rail from the locking member.

10. The slide rail assembly of claim 7, wherein the operating member is movably mounted to the second rail.

11. The slide rail assembly of claim 10, wherein the operating member has an elongated hole, the slide rail assembly further comprises a supporting member, the supporting member passes through a portion of the elongated hole for mounting the operating member to the second rail.

12. A slide rail assembly configured to mount a carried object to a rack, the slide rail assembly comprising:
a first rail mounted to the rack through a first bracket and a second bracket;
a second rail movable relative to the first rail between a retracted position and an extension position;
a third rail movable relative to the second rail and configured to be mounted with the carried object;
a locking member mounted to the second rail, wherein the locking member is configured to lock a portion of the first rail when the second rail is located at the extension position, such that the second rail is not movable relative to the first rail from the extension position toward the retracted position; and
an operating member configured to be manually operated to unlock the portion of the first rail from the locking member;
the second rail has a first side and a second side opposite to the first side, the first side faces toward the first rail, the second side faces toward the third rail, the operating member is located at the first side of the second rail, the second rail further has an extension hole, and the operating member comprises an auxiliary feature passing through the extension hole and located at the second side of the second rail wherein the second rail comprises an abutting feature, the slide rail assembly further comprises a releasing mechanism, the releasing mechanism comprises a linking member arranged on the third rail, when the linking member is in a first linking state, the linking member is located at a position corresponding to the abutting feature, and when the linking member is in a second linking state, the linking member is located at a position not corresponding to the abutting feature, wherein the releasing mechanism further comprises a releasing member operatively connected to the linking member, the linking member is configured to switch from the first linking state to the second linking state in response to operation of the releasing member.

13. The slide rail assembly of claim 12, further comprising an elastic member, wherein the locking member is held to lock the portion of the first rail in response to the elastic force of the elastic member.

* * * * *